(12) United States Patent
Chang et al.

(10) Patent No.: US 10,098,225 B2
(45) Date of Patent: Oct. 9, 2018

(54) FLEXIBLE ELECTRONIC MODULE AND MANUFACTURING METHOD THEREOF

(71) Applicant: Industrial Technology Research Institute, Hsinchu (TW)

(72) Inventors: Chih-Chia Chang, Hsinchu County (TW); Ming-Huan Yang, Taichung (TW); Cheng-Chung Lee, Hsinchu County (TW); Jia-Chong Ho, Hsinchu County (TW); Chen-Chu Tsai, Taichung (TW); Kun-Lin Chuang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 148 days.

(21) Appl. No.: 14/983,594

(22) Filed: Dec. 30, 2015

(65) Prior Publication Data
US 2016/0295689 A1    Oct. 6, 2016

Related U.S. Application Data

(60) Provisional application No. 62/140,478, filed on Mar. 31, 2015.

(30) Foreign Application Priority Data

Nov. 13, 2015    (TW) .............................. 104137430 A

(51) Int. Cl.
*H05K 1/02* (2006.01)
*H05K 1/18* (2006.01)
(Continued)

(52) U.S. Cl.
CPC ....... *H05K 1/0283* (2013.01); *H03K 17/9622* (2013.01); *H05K 1/189* (2013.01);
(Continued)

(58) Field of Classification Search
CPC ...... H05K 1/0283; H05K 1/189; H05K 3/284; H05K 3/007; H05K 2201/0191; H05K 2201/0187
See application file for complete search history.

(56) References Cited

U.S. PATENT DOCUMENTS

| | | | | |
|---|---|---|---|---|
| 5,445,869 | A | * | 8/1995 | Ishikawa ................ H05K 1/028 428/209 |
| 6,743,982 | B2 | * | 6/2004 | Biegelsen .............. B25J 13/084 174/69 |

(Continued)

FOREIGN PATENT DOCUMENTS

| | | |
|---|---|---|
| CN | 102902109 | 1/2013 |
| TW | 200534493 | 10/2005 |

(Continued)

OTHER PUBLICATIONS

Kim et al., "A Biaxial Stretchable Interconnect With Liquid-Alloy-Covered Joints on Elastomeric Substrate," Journal of Microelectromechanical Systems, Feb. 2009, pp. 138-146.
(Continued)

*Primary Examiner* — Nathan Milakovich
(74) *Attorney, Agent, or Firm* — JCIPRNET

(57) ABSTRACT

A flexible electronic module including a patterned flexible substrate, a stretchable material layer, and at least one electronic device is provided. The patterned flexible substrate includes at least one distributed region, and the stretchable material layer connects the distributed region. The electronic device is disposed on at least one of the patterned flexible substrate and the stretchable material layer. A manufacturing method of the flexible electronic module is also provided.

11 Claims, 17 Drawing Sheets

(51) Int. Cl.
*H05K 3/00* (2006.01)
*H03K 17/96* (2006.01)
*H05K 3/28* (2006.01)

(52) U.S. Cl.
CPC . *H03K 2217/960755* (2013.01); *H05K 3/007* (2013.01); *H05K 3/284* (2013.01); *H05K 2201/0187* (2013.01); *H05K 2201/0191* (2013.01)

(56) References Cited

U.S. PATENT DOCUMENTS

| | | | |
|---|---|---|---|
| 7,265,298 B2* | 9/2007 | Maghribi | A61N 1/0551 174/254 |
| 7,491,892 B2* | 2/2009 | Wagner | H05K 1/0283 174/254 |
| 8,207,473 B2* | 6/2012 | Axisa | B32B 37/185 174/254 |
| 8,604,485 B2 | 12/2013 | Tang et al. | |
| 8,895,865 B2* | 11/2014 | Lenahan | H05K 1/0215 174/254 |
| 8,912,094 B2* | 12/2014 | Koo | H01L 29/78603 257/586 |
| 8,973,832 B2* | 3/2015 | Matsumura | G06K 19/07749 235/488 |
| 9,247,637 B2* | 1/2016 | Hsu | H05K 1/0271 |
| 2008/0157235 A1 | 7/2008 | Rogers et al. | |
| 2008/0257586 A1* | 10/2008 | Chen | H01L 23/49816 174/254 |
| 2010/0002402 A1* | 1/2010 | Rogers | H01L 21/4867 361/749 |
| 2010/0143848 A1 | 6/2010 | Jain et al. | |
| 2010/0224950 A1 | 9/2010 | Dinyari et al. | |
| 2010/0330338 A1 | 12/2010 | Boyce et al. | |
| 2012/0051005 A1* | 3/2012 | Vanfleteren | H01L 21/565 361/749 |
| 2012/0052268 A1* | 3/2012 | Axisa | H01L 23/49838 428/212 |
| 2012/0300419 A1 | 11/2012 | Tang et al. | |
| 2014/0218872 A1* | 8/2014 | Park | H05K 1/0283 361/749 |
| 2014/0299362 A1* | 10/2014 | Park | H05K 1/0283 174/254 |
| 2014/0340857 A1* | 11/2014 | Hsu | H05K 1/0283 361/749 |
| 2014/0375465 A1* | 12/2014 | Fenuccio | G08B 5/36 340/691.1 |
| 2015/0065840 A1* | 3/2015 | Bailey | A61B 5/6802 600/384 |
| 2015/0380355 A1* | 12/2015 | Rogers | H01L 23/538 257/773 |
| 2016/0020500 A1* | 1/2016 | Matsuda | H01P 3/085 333/238 |
| 2016/0150636 A1* | 5/2016 | Otsubo | H05K 1/028 174/254 |
| 2017/0179434 A1* | 6/2017 | Chang | H01L 51/5256 |
| 2017/0332477 A1* | 11/2017 | Wang | H05K 1/028 |

FOREIGN PATENT DOCUMENTS

| | | |
|---|---|---|
| TW | 200644194 | 12/2006 |
| TW | 200713656 | 4/2007 |
| TW | 200727732 | 7/2007 |
| TW | 200843570 | 11/2008 |
| TW | I307962 | 3/2009 |
| TW | 201423979 | 6/2014 |
| TW | 201430640 | 8/2014 |
| TW | I483401 | 5/2015 |

OTHER PUBLICATIONS

Lipomi et al., "Skin-like pressure and strain sensors based on transparent elastic films of carbon nanotubes," Nature Nanotechnology, Oct. 23, 2011, pp. 788-792.

Lipomi et al., "Stretchable, elastic materials and devices for solar energy conversion," Energy & Environmental Science, Jun. 30, 2011, pp. 3314-3328.

Kim et al., "Flexible and Stretchable Electronics for Biointegrated Devices," Annual Review of Biomedical Engineering, Apr. 18, 2012, pp. 113-128.

Cheng et al., "The development of a highly twistable tactile sensing array with stretchable helical electrodes," Sensors and Actuators A: Physical, Dec. 16, 2009, pp. 226-233.

Kim et al., "Materials for stretchable electronics in bioinspired and biointegrated devices," MRS Bulletin, Mar. 2012, pp. 226-235.

* cited by examiner

FLEXIBLE ELECTRONIC MODULE AND MANUFACTURING METHOD THEREOF

CROSS-REFERENCE TO RELATED APPLICATION

This application claims the priority benefit of U.S. provisional application Ser. No. 62/140,478, filed on Mar. 31, 2015 and Taiwan application serial no. 104137430, filed on Nov. 13, 2015. The entirety of each of the above-mentioned patent applications is hereby incorporated by reference herein and made a part of this specification.

TECHNICAL FIELD

The technical field relates to a flexible electronic module and a manufacturing method thereof.

BACKGROUND

Typically, in order to achieve stability of electrical quality and reliability and durability of conductive wires for electronic products, electronic devices are commonly manufactured on a rigid carrier, such that the quality of the conductive wires can be prevented from being influenced, the conductive wires from being broken or a chip from being damaged due to deformation of the electronic products. However, manufacturing of the electronic devices on the rigid carrier results in significant limitations to the applicability of the electronic products. For instance, an electronic product with an overly large area has difficulty in being carried or worn by a user and inconvenience for storage. Additionally, such electronic products have difficulty in being attached to a part of a human, an animals and plant, or a mechanical structure having a curved surface.

With the progress of process technologies, some flexible electronic products are manufactured. However, there still are some limitations on the deformation of the flexible electronic products. For example, the flexible electronic products may be bendable, foldable, but still cannot be stretchable, which causes limitations to the applicability of the electronic products.

SUMMARY

According to an embodiment of the disclosure, a flexible electronic module including a patterned flexible substrate, a stretchable material layer and at least one electronic device is introduced. The patterned flexible substrate includes at least one distributed region, and the stretchable material layer is connected with the distributed region. The electronic device is disposed on at least one of the patterned flexible substrate and the stretchable material layer. The at least one electronic device includes a stretchable conductive wire.

According to an embodiment of the disclosure, a manufacturing method of a flexible electronic module is introduced. The manufacturing method includes: forming a flexible substrate; patterning the flexible substrate to form at least one distributed region; forming a stretchable material layer connected with the distributed region; and forming at least one electronic device on at least one of the flexible substrate and the stretchable material layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
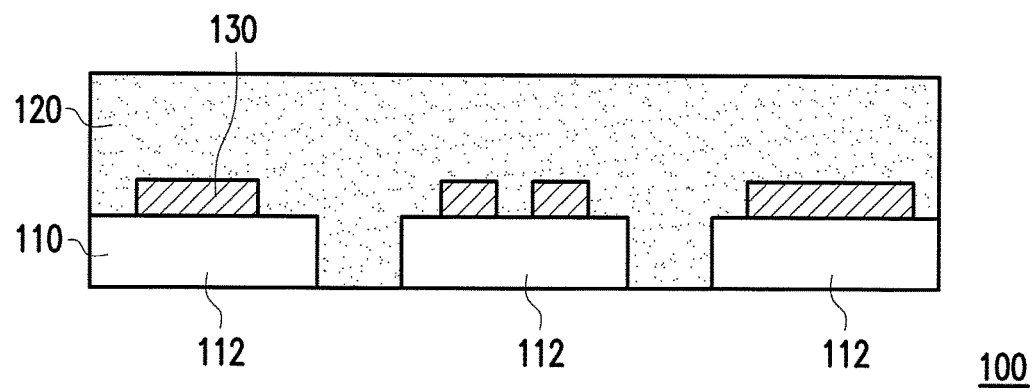
FIG. 1 is a schematic cross-sectional diagram illustrating a flexible electronic module according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic cross-sectional diagram illustrating a flexible electronic module according to an embodiment of the disclosure. With reference to FIG. 1, a flexible electronic module 100 of the present embodiment includes a patterned flexible substrate 110, a stretchable material layer 120 and at least one electronic device 130 (a plurality of electronic devices 130 are illustrated in FIG. 1 for example). The patterned flexible substrate 110 includes at least one distributed region 112 (a plurality of distributed regions 112 are illustrated in FIG. 1 for example), and the stretchable material layer 120 is connected with the distributed region 112. The electronic devices 130 are disposed on at least one of the patterned flexible substrate 110 and the stretchable material layer 120, which are illustrated as being disposed on the patterned flexible substrate 110 in FIG. 1 for example.

In the present embodiment, a ratios of a Young's modulus of the patterned flexible substrate 110 to a Young's modulus of the stretchable material layer 120 is greater than or equal to 10. In an embodiment, the ratio of the Young's modulus of the patterned flexible substrate 110 to the Young's modulus of the stretchable material layer 120 is greater than or equal to 50. Alternatively, in an embodiment, the ratio of the Young's modulus of the patterned flexible substrate 110 and the Young's modulus of the stretchable material layer 120 is greater than or equal to 100. In the present embodiment, a material of the patterned flexible substrate 110 may include polyimide (PI), polymethylmethacrylate (PMMA), polycarbonate (PC), polyethersulfone (PES), polyamide (PA), polyethylene terephthalate (PET), polyetheretherketone (PEEK), polyethylene naphthalate (PEN), polyethylenimine (PEI) or a combination thereof. A material of the stretchable material layer 120 may include polyurethane (PU), polydimethylsiloxane (PDMS), acrylic, a polymer containing ether series, polyolefin or a combination thereof.

In the present embodiment, each of the electronic devices 130 may include a conductive wire, an electrode, a resistor, an inductor, a capacitor, a transistor, a diode, a switch, an amplifier, a processor, a controller, a thin film transistor, a touch element, a pressure sensing element, a microelectromechanical element, a feedback element, an optical element, a display, or any other adaptive electronic device, which is not limited in the disclosure.

In the present embodiment, at least part of the distributed regions 112 are a plurality of island structures separated from each other. Taking FIG. 1 as an example, the distributed regions 112 are a plurality of island structures separated from one another, and the stretchable material layer 120 connects the island structures.

In the flexible electronic module 100 of the present embodiment, since the stretchable material layer 120 connects the distributed regions 112, the flexible electronic module 100 is provided with a capability of stretching effect with demand, so as to increase applicability of the flexible electronic module 100. For instance, with the stretching effect of the stretchable material layer 120 between two adjacent distributed regions 112, an interval between the two adjacent distributed regions 112 may be changed, so as to increase the applicability of the flexible electronic module 100.

Figure 2A:
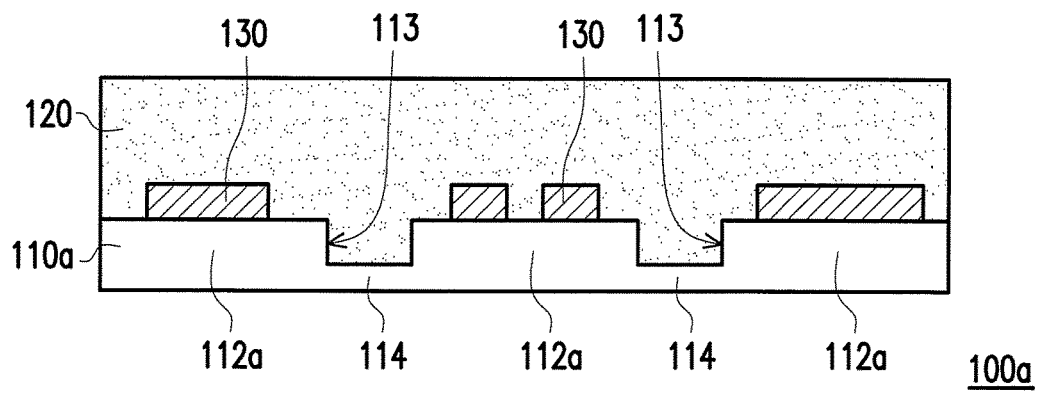
FIG. 2A to FIG. 2I are schematic cross-sectional diagrams illustrating nine variation embodiments of the flexible electronic module of FIG. 1.

FIG. 2A to FIG. 2I are schematic cross-sectional diagrams illustrating nine variation embodiments of the flexible electronic module of FIG. 1. The nine variation embodiments illustrated in FIG. 2A to FIG. 2I are similar to the flexible electronic module illustrated in FIG. 1, and the main difference therebetween will be described below. Referring to FIG. 2A, in a flexible electronic module 100a of the present embodiment, at least part of distributed regions 112a are a plurality of bump structures. For instance, in FIG. 2A, the distributed regions 112a of a patterned flexible substrate 110a are a plurality of bump structures, respectively. A recess 113 is between adjacent two bump structures (i.e., two adjacent distributed regions 112a) of the patterned flexible substrate 110a, and the adjacent two bump structures are connected together through a bottom 114 of the recess 113.

In the flexible electronic module 100a of the present embodiment, since the two adjacent distributed regions 112a are connected together through the bottom 114 of the recess 113, the flexible electronic module 100a has a greater tensile strength, but still may be stretched in a certain degree and direction.

Figure 2B:
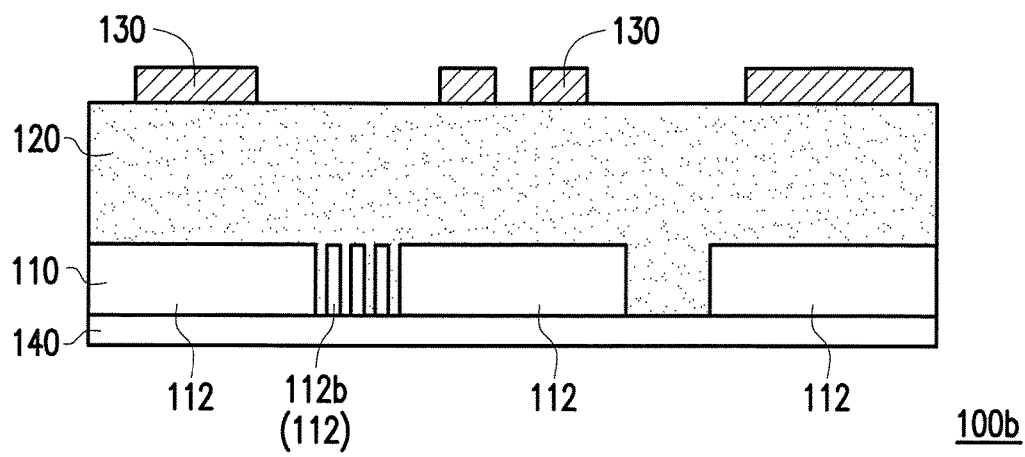

Then referring to FIG. 2B, a flexible electronic module 100b of the present embodiment further includes a de-bonding layer 140 disposed on the patterned flexible substrate 110. In the present embodiment, the de-bonding layer 140 is further disposed on the stretchable material layer 120. Additionally, in the present embodiment, an adhesive force between the stretchable material layer 120 and the patterned flexible substrate 110 is greater than an adhesive force between the patterned flexible substrate 110 and the de-bonding layer 140. A material of the de-bonding layer 140 includes, for example, crystalline silicate, aromatic polyimide (which is formed by copolymerizing diamine and anhydride), where the diamine is, for example, 4,4'-oxydianiline, 3,4'-oxydianiline, p-Phenylenediamine (PPD), 2,2'-bis(trifluoromethyl)benzidine or a combination thereof, and the anhydride is, for example, pyromellitic dianhydride (PMDA), biphenyltetracarboxylic dianhydride (BPDA), 4,4'-(hexafluoroisopropylidene)diphthalic anhydride or a combination thereof.

Additionally, in the present embodiment, the electronic devices 130 are disposed on the stretchable material layer 120. Besides, in the present embodiment, the distributed regions 112b of the patterned flexible substrate 110 may also have a smaller width.

Figure 2C:
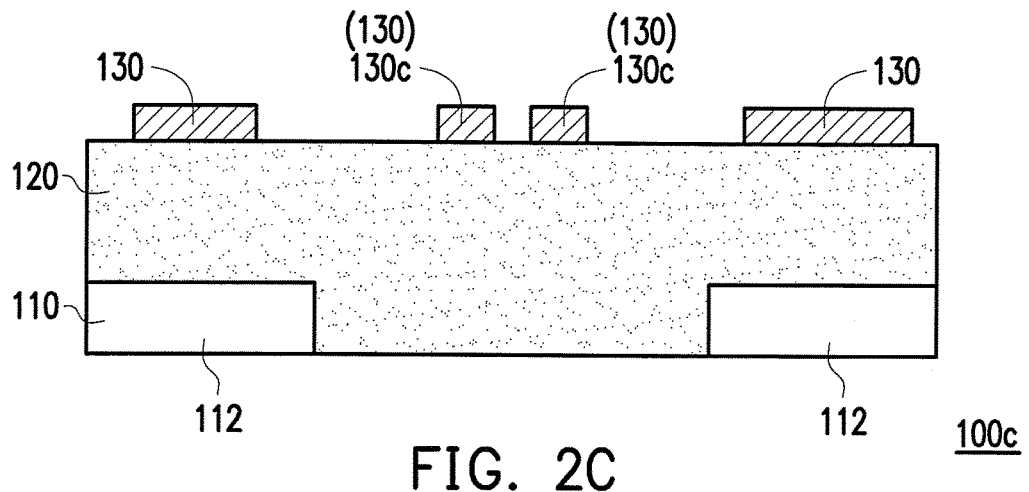

With reference to FIG. 2C, in a flexible electronic module 100c of the present embodiment, electronic devices 130c may be electronic devices capable of sensing a stretching degree and disposed on the stretchable material layer 120 and located on part of the stretchable material layer 120 which is located on the two adjacent distributed regions 112. In this way, the electronic devices 130c are capable of sensing the stretching degree of the stretchable material layer 120.

Figure 2D:
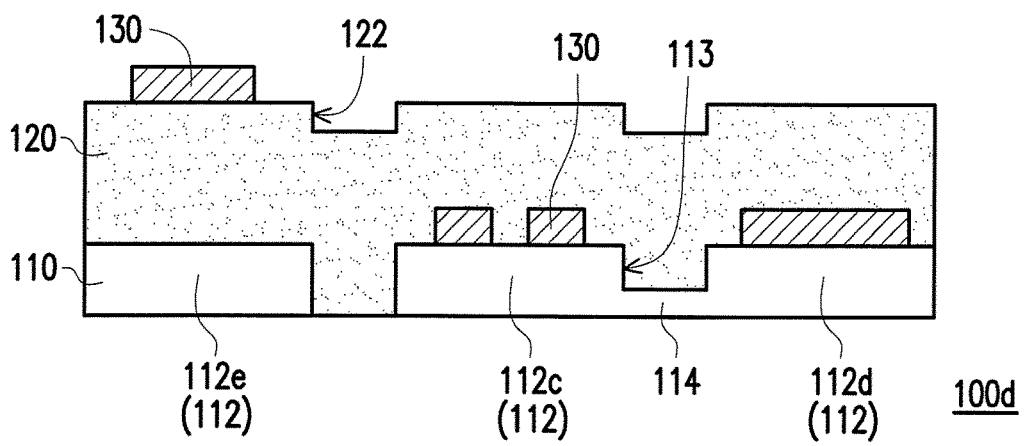

With reference to FIG. 2D, in a flexible electronic module 100d of the present embodiment, a surface of the stretchable material layer 120 may have a pattern, such as a recess 122. Additionally, a part of the electronic devices 130 are disposed on the stretchable material layer 120, and another part of the electronic devices 130 are disposed on patterned flexible substrate 110. Additionally, in the present embodiment, a part of the distributed regions, e.g., 112e and 112c, are island structures separated from each other, and part of the distributed regions, e.g., 112c and 112d, form bump structures connected together through the bottom 114 of the recess 113.

Figure 2E:
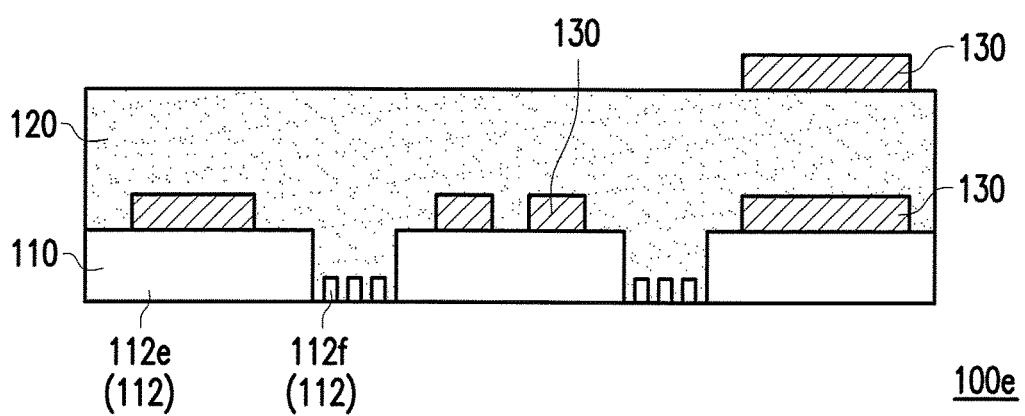

With reference to FIG. 2E, in a flexible electronic module 100e of the present embodiment, a thickness of part of the distributed regions, e.g., 112f, may be thinner than a thickness of another part of the distributed regions, e.g., 112e. In an embodiment, the distributed regions 112f may be a part left from a manufacturing process.

Figure 2F:
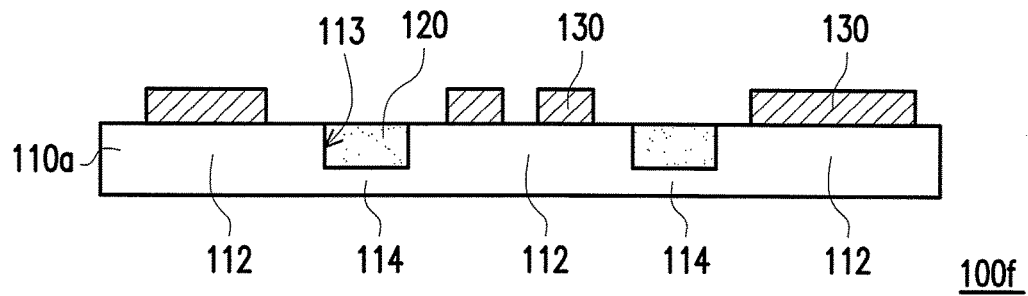

With reference to FIG. 2F, in a flexible electronic module 100f of the present embodiment, the stretchable material layer 120 may be filled in the recess 113 between two adjacent distributed regions 112 of the patterned flexible substrate 110a, without covering the distributed regions 112.

Figure 2G:
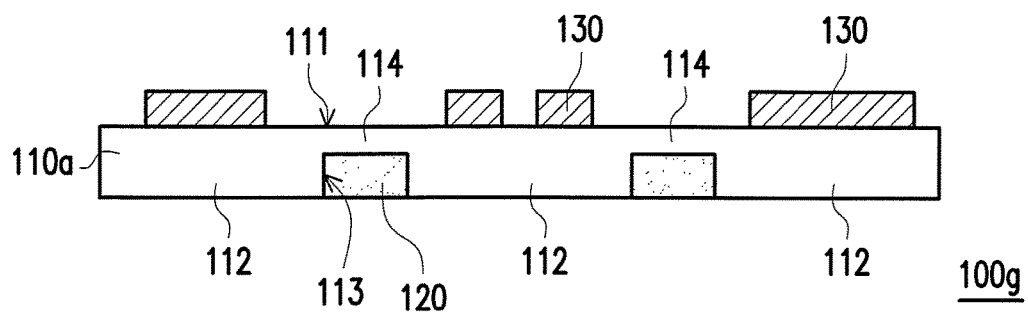

With reference to FIG. 2G, in a flexible electronic module 100g of the present embodiment, the electronic devices 130 are disposed on a disposition surface 111 of the patterned flexible substrate 110a, and an opening of the recess 113 between the two adjacent distributed regions 112 faces toward a direction departing from the disposition surface 111.

Figure 2H:
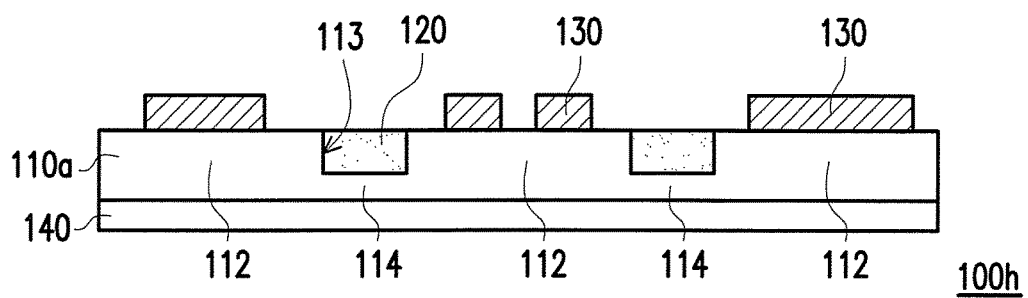

With reference to FIG. 2H, in a flexible electronic module 100h of the present embodiment, the de-bonding layer 140 is disposed on a lower surface of the patterned flexible substrate 110a and on a lower surface of the bottom 114 of the recess 113 between the two adjacent distributed regions 112.

Figure 2I:
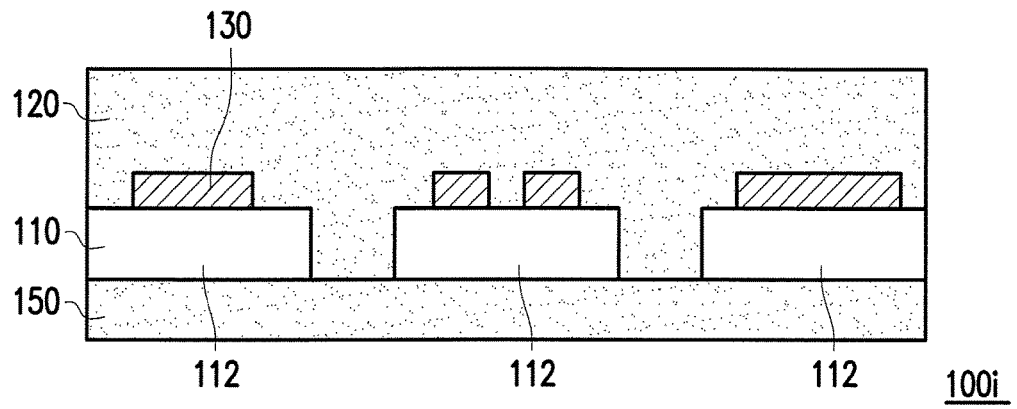

With reference to FIG. 2I, a flexible electronic module 100i of the present embodiment further includes a covering layer 150. The patterned flexible substrate 110 is disposed between the stretchable material layer 120 and the covering layer 150, and a material of the covering layer 150 is a stretchable material. The covering layer 150 and the stretchable material layer 120 may be made of the same stretchable material or different stretchable materials.

FIG. 3A to FIG. 3E are schematic top-view diagrams illustrating patterned flexible substrates and stretchable material layers of flexible electronic modules according to another five embodiments of the disclosure. FIG. 3A to FIG. 3E illustrate flexible electronic modules similar to the flexible electronic modules illustrated in FIG. 1 and FIG. 2A to FIG. 2I, cross-sectional views thereof may be similar to those illustrated in FIG. 2A to FIG. 2I, and top views of the patterned flexible substrate 110 and the stretchable material layer 120 may be as illustrated in FIG. 3A to FIG. 3E.

Figure 3A:
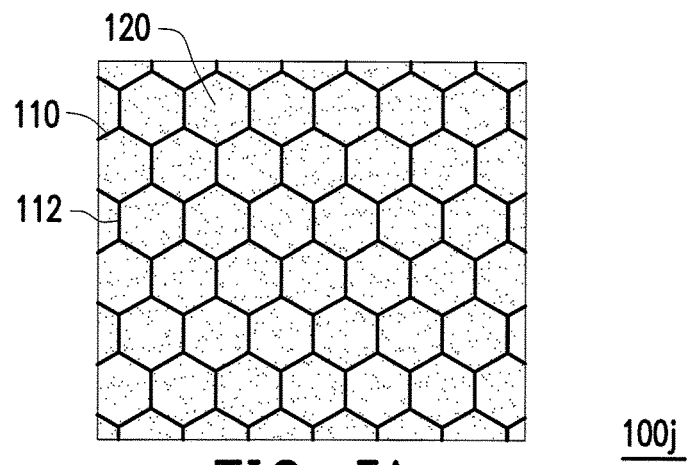
FIG. 3A to FIG. 3E are schematic top-view diagrams illustrating patterned flexible substrates and stretchable material layers of flexible electronic modules according to another five embodiments of the disclosure.
Figure 3B:
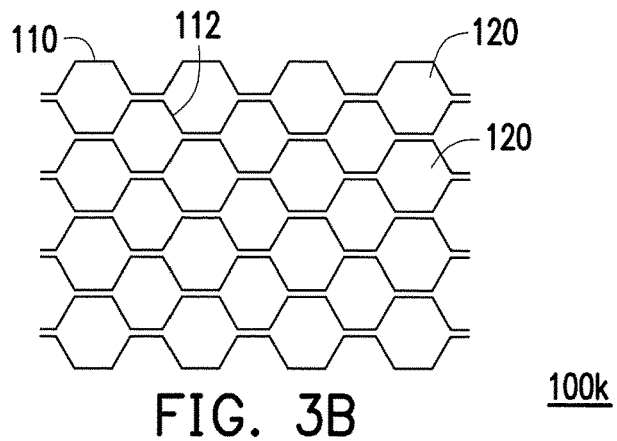
Figure 3C:
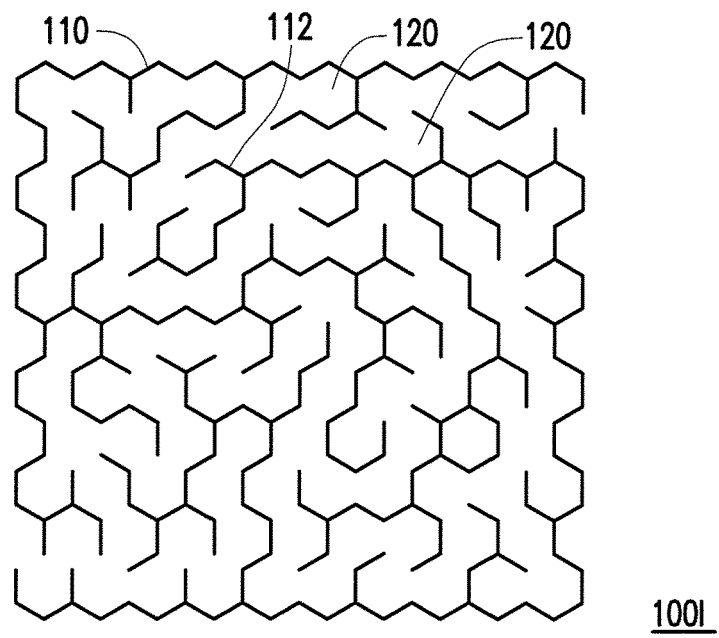
Figure 3D:
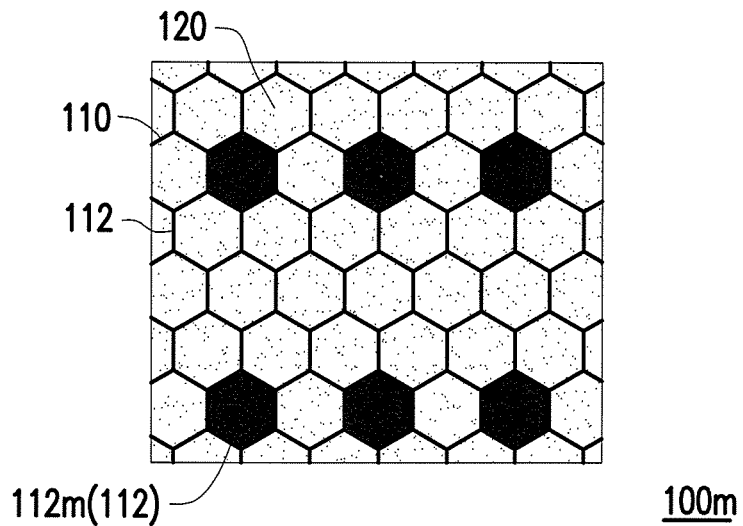
Figure 3E:
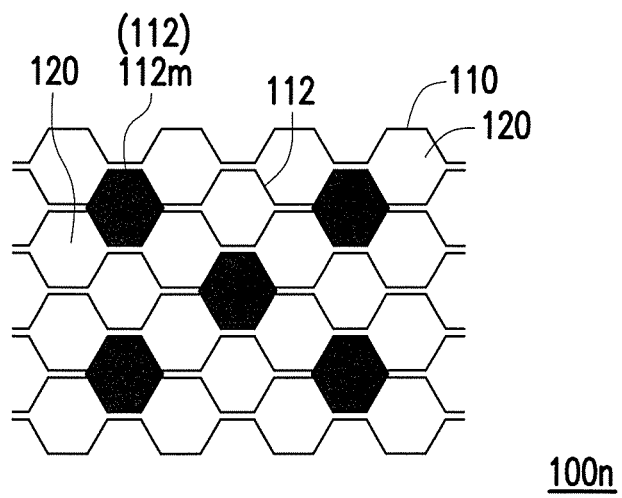

With reference to FIG. 3A to FIG. 3E, in flexible electronic modules 100j, 100k, 100l, 100m and 100n, at least part of the distributed regions 112 have mesh structures, and the stretchable material layer 120 is filled in gaps of the mesh structure. For instance, in the flexible electronic modules 100j, 100k and 100l, all of the distributed regions 112 have the mesh structures, while in the flexible electronic module 100m and 100n, part of the distributed regions 112 have the mesh structures, and another part of the distributed region 112m have island structures. Additionally, the mesh distributed regions 112 may be connected together to form a net (as illustrated in FIG. 3A and FIG. 3D) or separated into a plurality of sections (as illustrated in FIG. 3B, FIG. 3C and FIG. 3E).

Figure 4A:
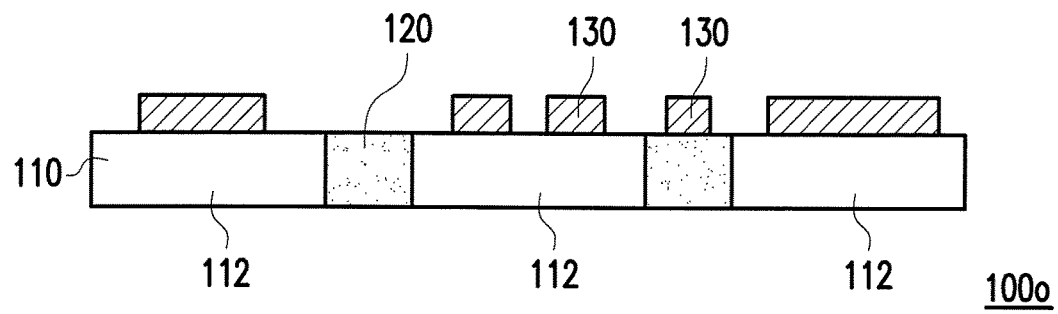
FIG. 4A to FIG. 4D are schematic cross-sectional diagrams illustrating flexible electronic modules according to another four embodiments of the disclosure.
Figure 4B:
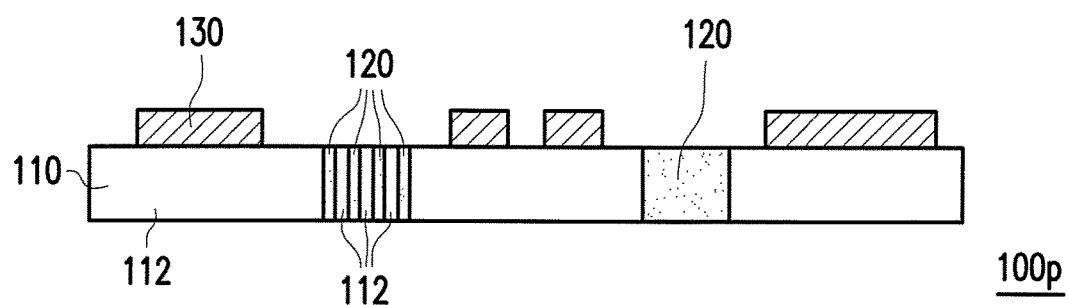
Figure 4C:
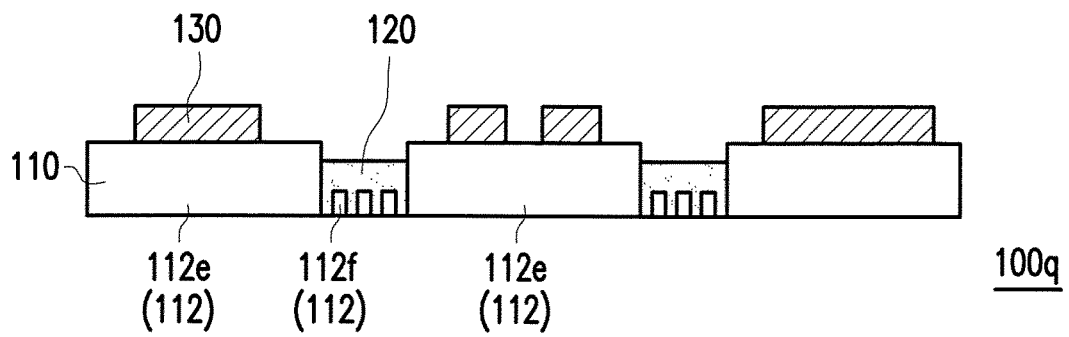

FIG. 4A to FIG. 4D are schematic cross-sectional diagrams illustrating flexible electronic modules according to another four embodiments of the disclosure. FIG. 4A to FIG. 4D illustrate flexible electronic modules similar to the flexible electronic modules illustrated in FIG. 1 and FIG. 2A to FIG. 2I, and difference among the embodiments will be described below. With reference to FIG. 4A and FIG. 4B, in flexible electronic modules 100o and 100p, the distributed regions 112 may be island structures, and the stretchable material layer 120 is filled in a gap between every two adjacent island structures, without covering the distributed regions. With reference to FIG. 4C, in a flexible electronic module 100q, the stretchable material layer 120 is filled between two adjacent distributed regions 112e with a thicker thickness, without covering the distributed regions 112e. Additionally, the stretchable material 120 covers the distributed region 112f with a thinner thickness.

Figure 4D:
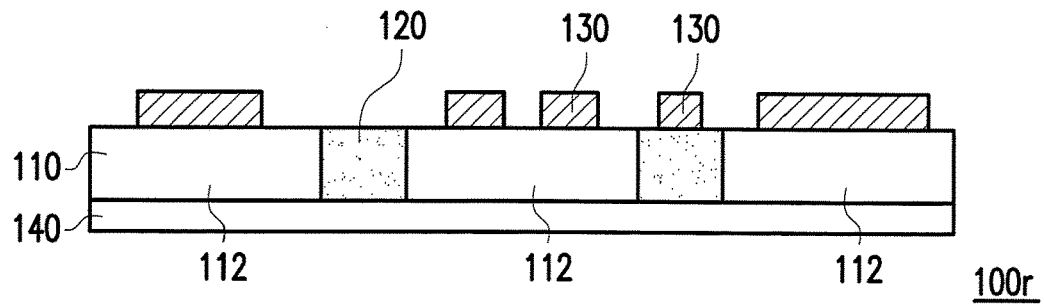

With reference to FIG. 4D, a flexible electronic module 100r of the present embodiment is similar to the flexible electronic module 100o illustrated in FIG. 4A, and the difference therebetween lies in the flexible electronic module 100r further including the de-bonding layer 140 disposed on the patterned flexible substrate 110 and the stretchable material layer 120. The de-bonding layer 140 of FIG. 4D may also be disposed on lower surfaces of the patterned flexible substrate 110 and the stretchable material layer 120 illustrated in FIG. 4A to FIG. 4C.

Figure 5A:
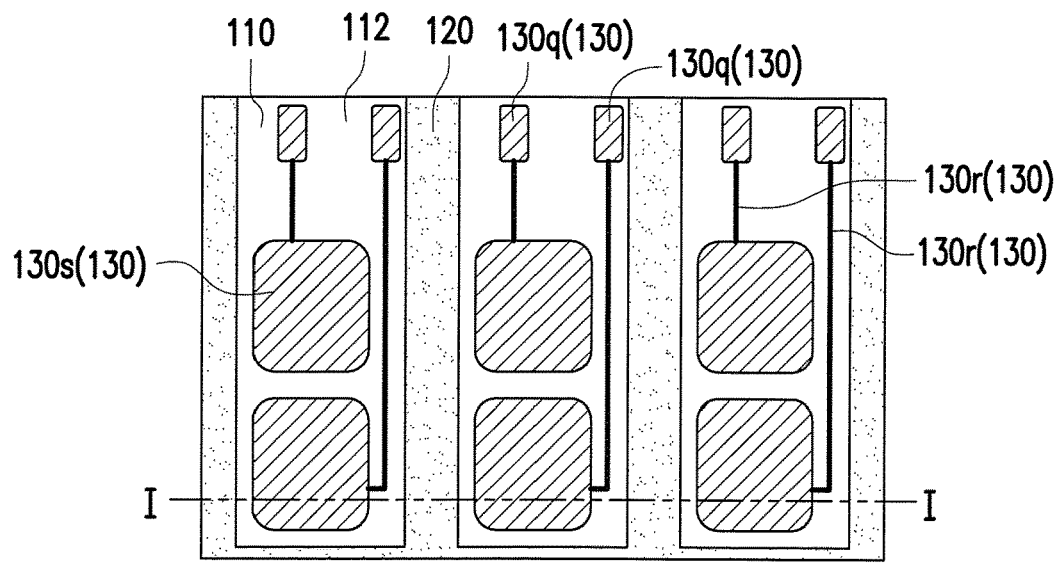
FIG. 5A is a schematic top-view diagram illustrating a flexible electronic module according to another embodiment of the disclosure.
Figure 5B:
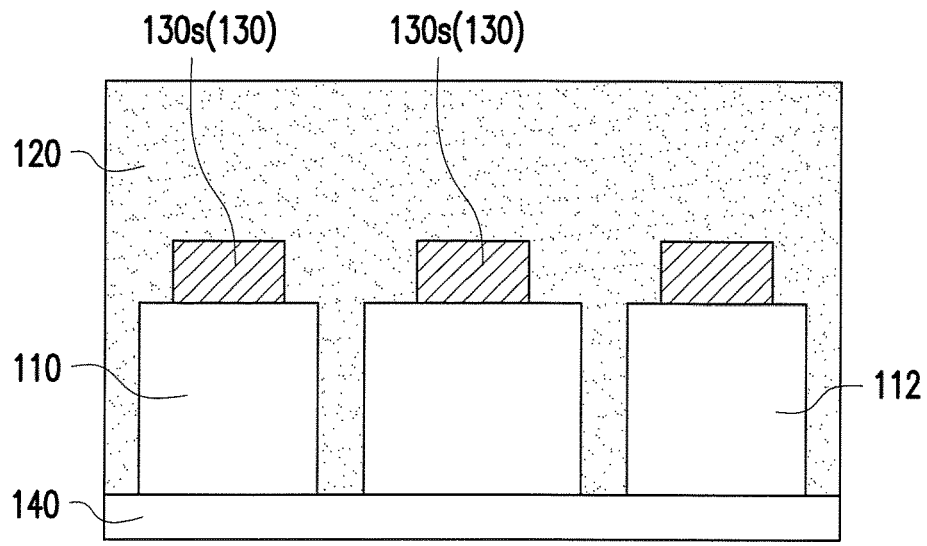
FIG. 5B is a schematic cross-sectional diagram of the flexible electronic module of FIG. 5A along a line I-I.

FIG. 5A is a schematic top-view diagram illustrating a flexible electronic module according to another embodiment of the disclosure, and FIG. 5B is a schematic cross-sectional diagram of the flexible electronic module of FIG. 5A along a line I-I. With reference to FIG. 5A and FIG. 5B, a flexible electronic module 100s of the present embodiment is similar to the flexible electronic module 100 illustrated in FIG. 1, and the difference therebetween will be described below. In the flexible electronic module 100s of the present embodiment, the electronic devices 130 include a plurality of touch sensing electrodes 130s disposed on the patterned flexible substrate 110. In the present embodiment, the electronic devices 130 further include a plurality of conductive wires 130r and a plurality of bonding pads 130q. The conductive wires 130r electrically connect the touch sensing electrodes 130s to the bonding pads 130q, respectively, and the bonding pads 130q may be electrically connected to an external flexible printing circuit board. In this way, the flexible electronic module 100s may be a stretchable touch thin film. In the present embodiment, the conductive wires 130r and the bonding pads 130q are made of metal, and the touch sensing electrodes 130s are made of metal or metal oxide with conductivity. Additionally, all the conductive wires 130r, the bonding pads 130q and the touch sensing electrodes 130s belong to the electronic devices 130.

Figure 6:
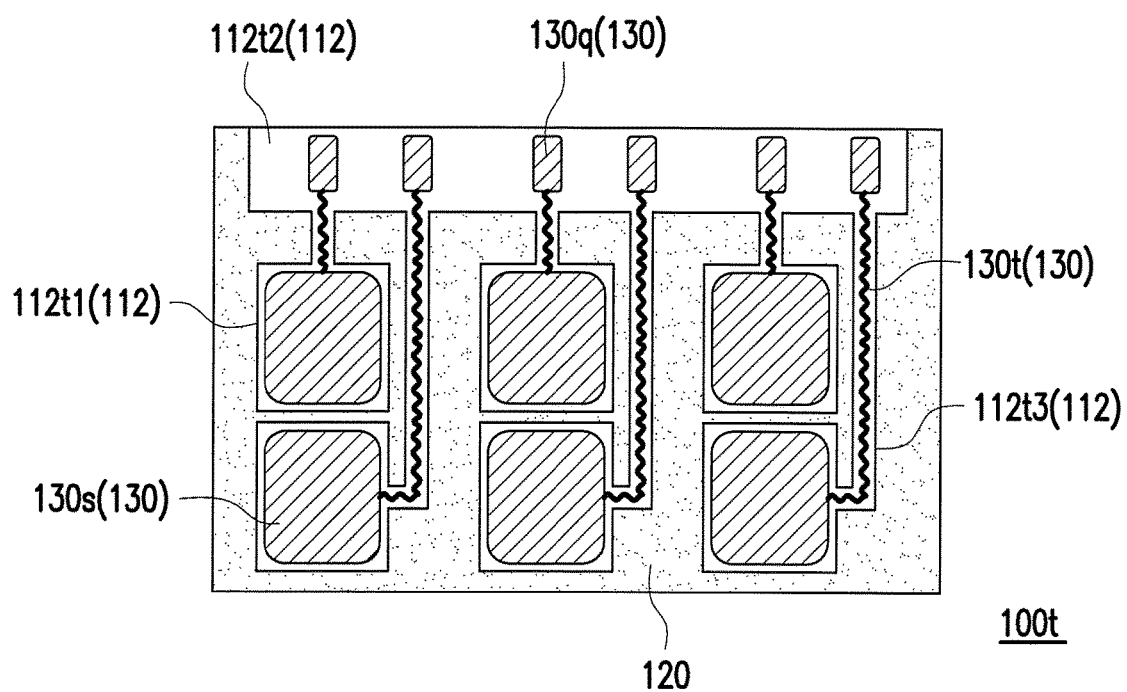
FIG. 6 is a schematic top-view diagram illustrating a flexible electronic module according to yet another embodiment of the disclosure.

FIG. 6 is a schematic top-view diagram illustrating a flexible electronic module according to yet another embodiment of the disclosure. With reference to FIG. 6, a flexible electronic module 100t of the present embodiment is similar to the flexible electronic module 100s illustrated in FIG. 5A, and the difference therebetween will be described below. In the flexible electronic module 100t of the present embodiment, the electronic devices 130 include a plurality of stretchable conductive wires 130t, and the stretchable conductive wires 130t extend in a zigzag shape. The stretchable conductive wires 130t electrically connect the touch sensing electrodes 130s to the bonding pads 130q, respectively.

Additionally, in the present embodiment, each of the touch sensing electrodes 130s is disposed on a distributed region 112t1 thereof, the bonding pad 130q is disposed on a distributed region 112t2, and each of the stretchable conductive wires 130t is disposed on a distributed region 112t3 thereof. The distributed region 112t3 connects the distributed region 112t1 and the distributed region 112t2, and the distributed region 112t3 extends along with the stretchable conductive wire 130t.

Referring to FIG. 5A, the flexible electronic module 100s may stretched in a lateral direction on FIG. 5A. However, in FIG. 6, the flexible electronic module 100t uses the stretchable conductive wires 130t, and thus, the flexible electronic module 100t may be stretched in both the lateral and longitudinal directions on FIG. 6.

FIG. 7A to FIG. 7G are schematic cross-sectional diagram illustrating steps of a manufacturing method of a flexible electronic module according to an embodiment of the disclosure. With reference to FIG. 7A to FIG. 7G, the manufacturing method of the flexible electronic module of the present embodiment may be applied to manufacture the flexible electronic modules 100 and 100a to 100t of the embodiments above, and the manufacturing of the flexible electronic module 100 is illustrated herein for example. The manufacturing method of the flexible electronic module of the present embodiment includes the following steps. First, with reference to FIG. 7A, a flexible substrate 110' is formed. In the present embodiment, before forming the flexible substrate 110', a de-bonding layer 140 is formed on a rigid carrier 50. The step of forming the flexible substrate 110' includes forming the flexible substrate 110' on the de-bonding layer 140, and an adhesive force between the de-bonding layer 140 and the flexible substrate 110' is greater than an adhesive force between the de-bonding layer 140 and the rigid carrier 50. A material of the rigid carrier 50 is, for example, glass, ceramic, metal, silicon or any other adaptive rigid material.

Figure 7A:
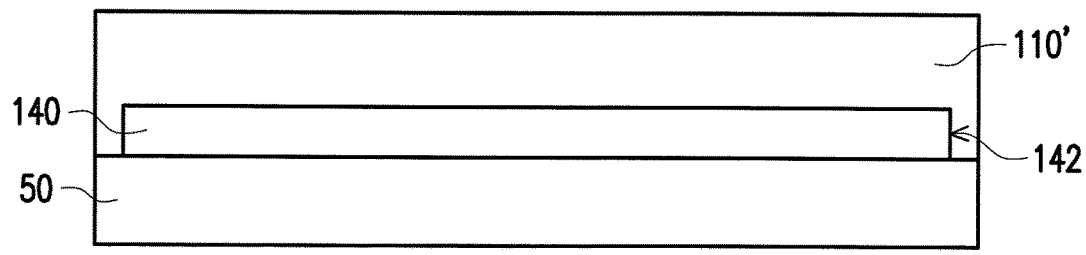
FIG. 7A to FIG. 7G are schematic cross-sectional diagram illustrating steps of a manufacturing method of a flexible electronic module according to an embodiment of the disclosure.
Figure 7B:
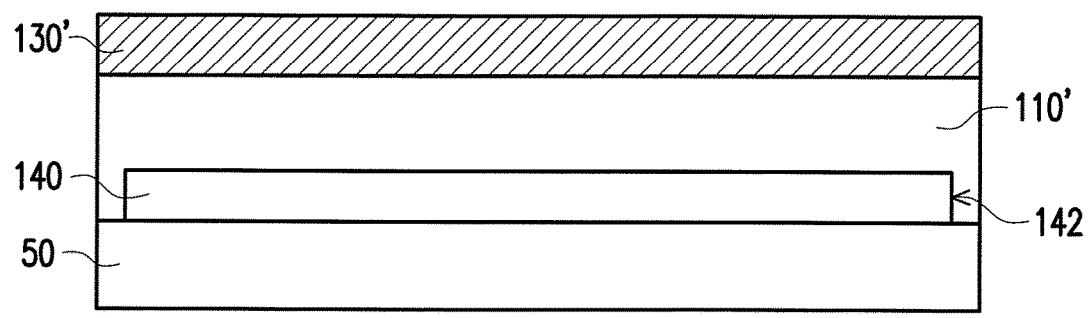
Figure 7C:
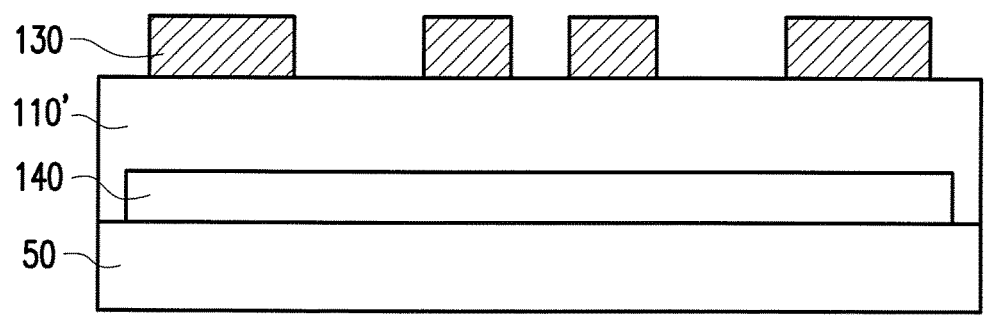
Figure 7D:
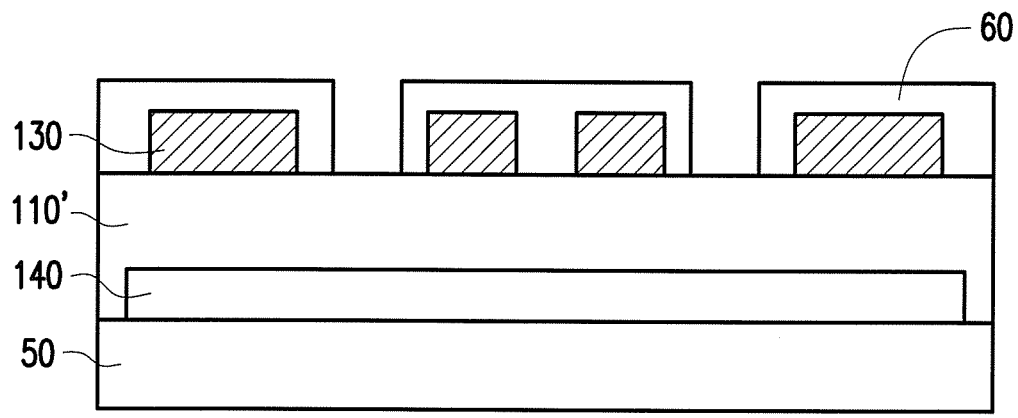
Figure 7E:
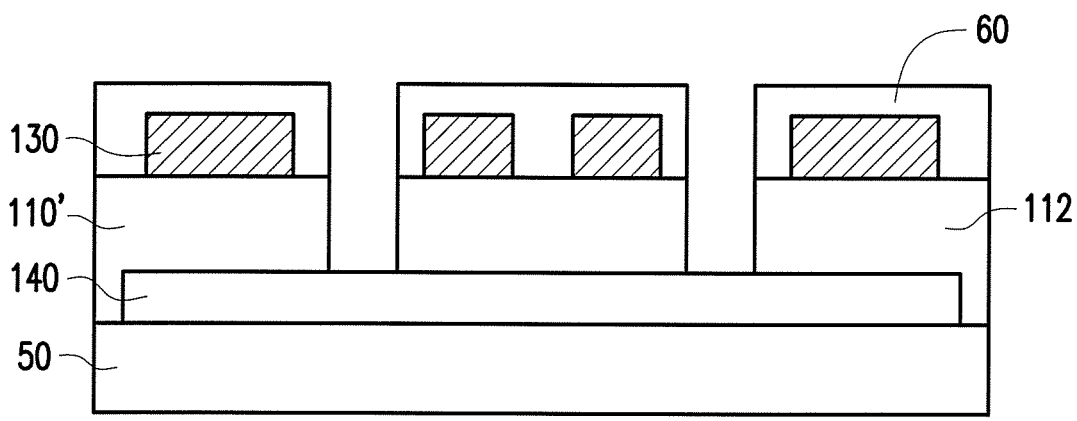

Thereafter, the flexible substrate 110' is patterned to form at least one distributed region 112 (referring to FIG. 7E). Additionally, a stretchable material layer 120 connected with the distributed regions 112 is formed (referring to FIG. 7G), and then, at least one electronic device 130 is formed on at least one of the flexible substrate 110' and the stretchable material layer 120 (referring to FIG. 7C). In the present embodiment, a ratio of a Young's modulus of the flexible substrate 110' to a Young's modulus of the stretchable material layer 120 is greater than or equal to 10. In an embodiment, the ratio of the Young's modulus of the flexible substrate 110' to the Young's modulus of the stretchable material layer 120 is greater than or equal to 50. Alternatively, in an embodiment, the ratio of the Young's modulus of the flexible substrate 110' to the Young's modulus of the stretchable material layer 120 is greater than or equal to 100.

In the present embodiment, referring to FIG. 7B, a conductive layer 130' is formed on the flexible substrate 110' before being patterned. Then, with reference to FIG. 7C, the conductive layer 130' is patterned to form the at least one electronic device 130. For instance, the conductive layer 130' may be patterned by a photolithography process to form the electronic devices 130.

Afterwards, with reference to FIG. 7D, a patterned mask layer 60 covering the electronic devices 130 are formed on the flexible substrate 110'. Then, with reference to FIG. 7E, the portion of the flexible substrate 110' exposed by the patterned mask layer 60 is etched, dug or imprinted by using the patterned mask layer 60 as a barrier layer to form the distributed regions 112. When the portion of the flexible substrate 110' exposed by the patterned mask layer 60 is etched, the patterned mask layer 60 is an etching barrier layer capable of resisting erosion by the etchant. Additionally, the aforementioned etching process includes dry etching or wet etching.

Figure 7F:
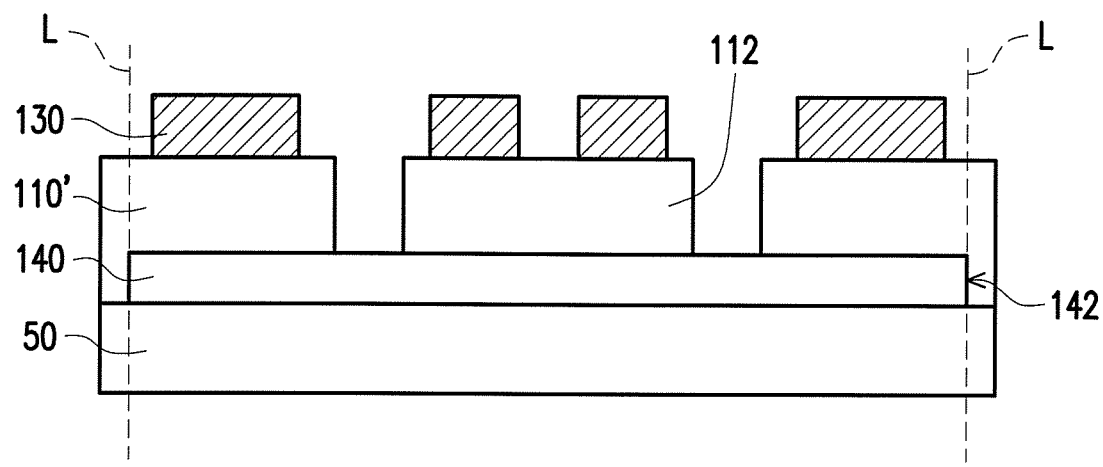

Afterwards, referring to FIG. 7F, the patterned mask layer 60 is removed by, for example, a dry etching process or a wet etching process. In the present embodiment, a material of the patterned mask layer includes, for example, metal. However, in other embodiments, the next step may be performed directly without removing the patterned mask layer 60. Thereafter, referring to FIG. 7G, a stretchable material layer 120 is formed on the flexible substrate 110', the stretchable material layer 120 is filled in a gap 115 between the distributed regions 112, and the electronic devices 130 are covered by the stretchable material layer 120. In the present embodiment, when the flexible substrate 110' is formed on the de-bonding layer 140 (as illustrated in FIG. 7A), edges 142 of the de-bonding layer 140 are covered by the flexible substrate 110'. In the step illustrated in FIG. 7G, the part of the flexible substrate 110' covering the edges 142 of the de-bonding layer 140 is cut off (e.g., in a direction along a dotted line L in FIG. 7F), and the rigid carrier 50 is separated from the de-bonding layer 140. In the present embodiment, since an adhesive force between the de-bonding layer 140 and the flexible substrate 110' is greater than an adhesive force between the de-bonding layer 140 and the rigid carrier 50, the rigid carrier 50 may be peeled off from the de-bonding layer 140 easily when the part of the flexible substrate 110' covering the edges 142 of the de-bonding layer 140 is cut off. After the rigid carrier 50 is peeled off, the remaining part forms the flexible electronic module. Alternatively, since an adhesive force between the stretchable material layer 120 and the flexible substrate 110' is greater than the adhesive force between the flexible substrate 110' and the de-bonding layer 140, the de-bonding layer 140 is further peeled from the flexible substrate 110', and the remaining part forms the flexible electronic module 100 illustrated in FIG. 1. In this way, a stretchable flexible electronic module 100 may be foil ed.

Figure 7G:
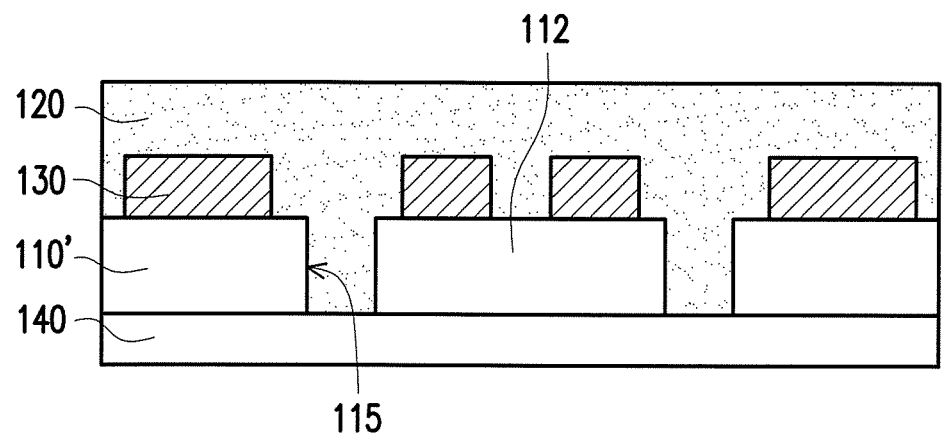
Figure 8A:
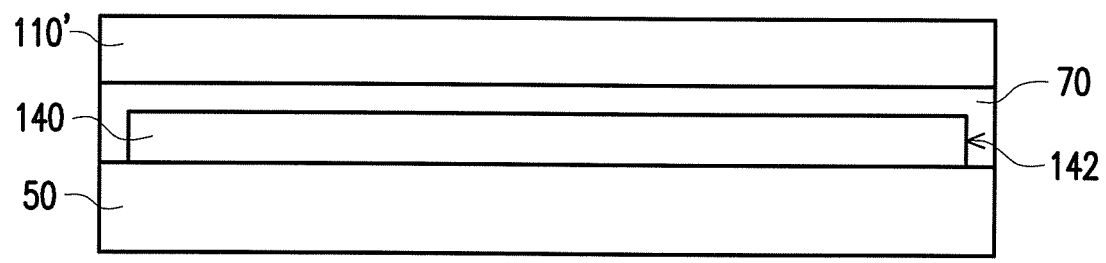
FIG. 8A and FIG. 8B illustrate two steps of a manufacturing method of the flexible electronic module according to another embodiment of the disclosure.
Figure 8B:
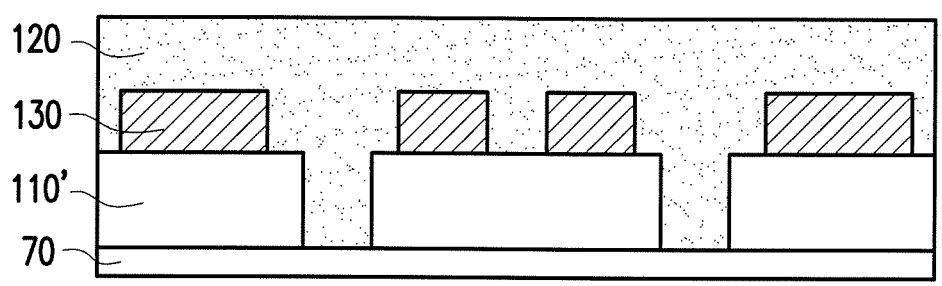

FIG. 8A and FIG. 8B illustrate two steps of a manufacturing method of the flexible electronic module according to another embodiment of the disclosure. With reference to FIG. 8A and FIG. 8B, the present embodiment provides a manufacturing method of the flexible electronic module similar to the manufacturing method of the flexible electronic module of the embodiment illustrated in FIG. 7A to FIG. 7G, and the difference therebetween will be described below. In the manufacturing method of the flexible electronic module of the present embodiment, referring to FIG. 8A, a modification layer 70 is formed on the de-bonding layer 140, wherein the flexible substrate 110' is formed on the modification layer 70, and the modification layer 70 is disposed between the flexible substrate 110' and the de-bonding layer 140 to increase the adhesive force between the de-bonding layer 140 and the flexible substrate 110'. In the present embodiment, the edges 142 of the de-bonding layer 140 are covered by the modification layer 70. In the present embodiment, a material of the modification layer 70 may include, for example, silicon nitride or silicon oxide.

Thereafter, the follow-up steps of the manufacturing method of the flexible electronic module of the present embodiment that are similar to those of the embodiment illustrated in FIG. 7B to FIG. 7F are performed and thus, will not be repeatedly described. However, referring to FIG. 8B, after the part of the modification layer 70 covering the edges 142 of the de-bonding layer 140 is cut off, the rigid carrier 50 is peeled off, and the remaining part forms the flexible electronic module. Additionally, the de-bonding layer 140 may be further peeled off from the modification layer 70, and the remaining part also foul's the flexible electronic module.

Figure 9A:
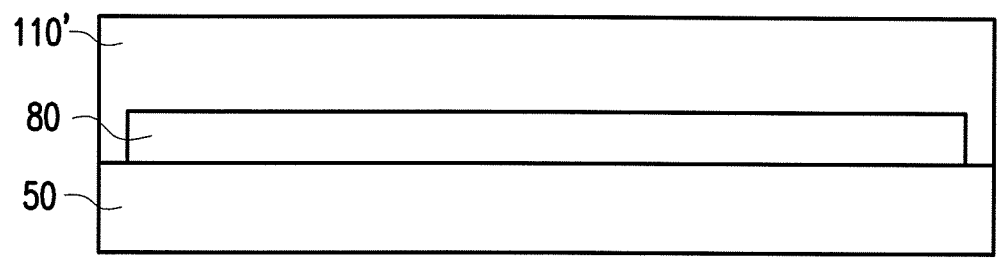
FIG. 9A and FIG. 9B illustrate two steps of a manufacturing method of the flexible electronic module according to yet another embodiment of the disclosure.
Figure 9B:
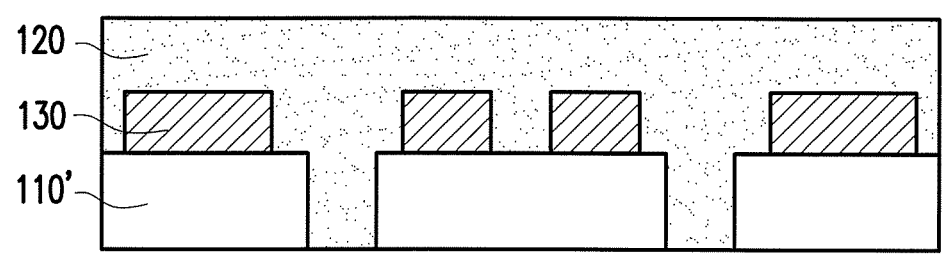

FIG. 9A and FIG. 9B illustrate two steps of a manufacturing method of the flexible electronic module according to yet another embodiment of the disclosure. With reference to FIG. 9A and FIG. 9B, the present embodiment provides a manufacturing method of the flexible electronic module similar to the manufacturing method of the flexible electronic module of the embodiment illustrated in FIG. 7A to FIG. 7G, and the difference therebetween will be described below. In the present embodiment, before the flexible substrate 110' is formed, a sacrificial layer 80 is formed on the rigid carrier, and the step of forming the flexible substrate 110' includes forming the flexible substrate 110' on the sacrificial layer 80. In other words, the sacrificial layer 80 is used to replace the de-bonding layer 140 illustrated in FIG. 7A in the present embodiment.

Thereafter, the steps similar to those illustrated in FIG. 7B to FIG. 7F are performed. Then, referring to FIG. 9B, after the flexible substrate 110' is patterned, the stretchable material layer 120 is formed, and the electronic devices 130 are formed, the sacrificial layer 80 is irradiated by laser, for example, the laser passing through the rigid carrier 50 is used to irradiate the sacrificial layer 80, such that the flexible substrate 110' is separated from the rigid carrier 50. In other words, a material used by the sacrificial layer 80 may allow the flexible substrate 110' and the rigid carrier 50 to be separated from each other when the sacrificial layer 80 is irradiated by the laser. In this way, after the rigid carrier 50 is removed off by the laser lift-off method, the remaining part forms the stretchable flexible electronic module. In the present embodiment, a material of the sacrificial layer 80 includes, for example, poly(styrene sulfonate) (PSS), poly(ethylene imine) (PEI), poly(allyl amine) (PAA), poly(diallyldimethylammonium chloride) PDDA), poly(N-isopropyl acrylamide) (PNIPAM), Chitosan (CS), poly(methacrylic acid) (PMA), poly(vinyl sulfonic acid) (PVS), poly(amic acid) (PAA) or poly(allylamine) (PAH) which is ionized in a water solution and charged with a positive charge, or alternatively, the material of the sacrificial layer 80 may include one of or a combination of at least two selected from the group consisting of sodium poly(styrene sulfonate) (NaPSS) and poly(vinly sulfonic acid) (PVS).

Figure 10A:
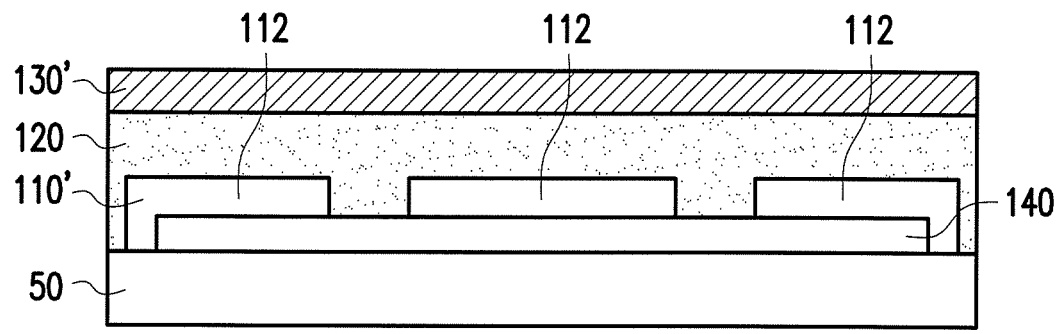
FIG. 10A to FIG. 10E are schematic cross-sectional diagram illustrating steps of a manufacturing method of the flexible electronic module according to yet another embodiment of the disclosure.
Figure 10B:
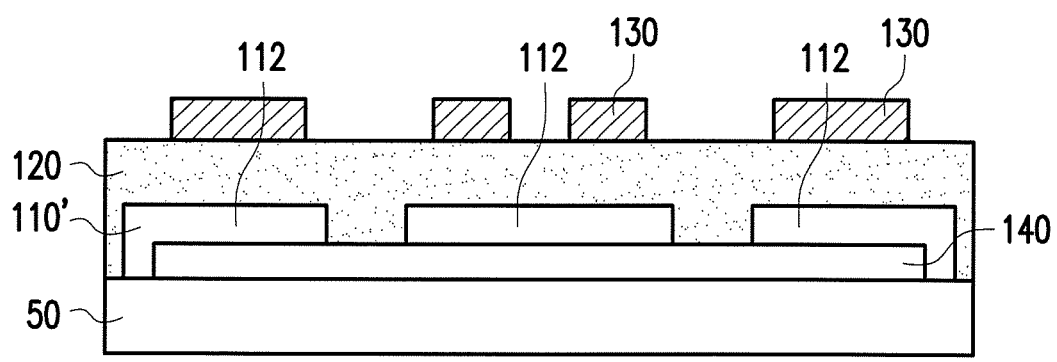
Figure 10C:
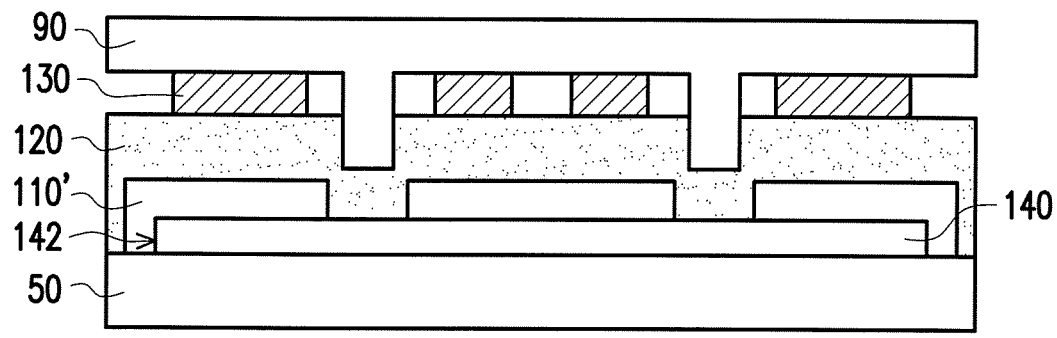
Figure 10D:
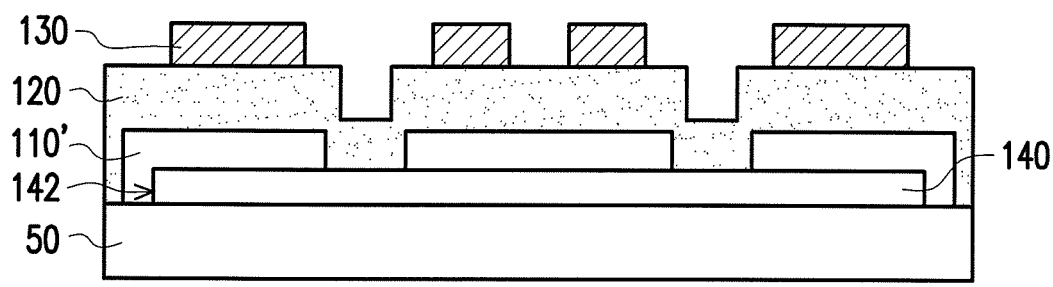
Figure 10E:
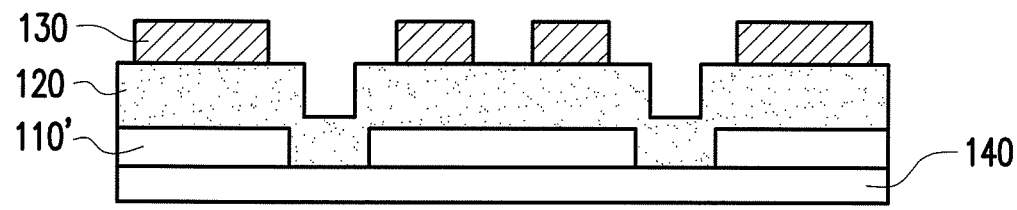

FIG. 10A to FIG. 10E are schematic cross-sectional diagram illustrating steps of a manufacturing method of the flexible electronic module according to yet another embodiment of the disclosure. With reference to FIG. 10A and FIG. 10E, the present embodiment provides a manufacturing method of the flexible electronic module similar to the manufacturing method of the flexible electronic module of the embodiment illustrated in FIG. 7A to FIG. 7G, and the difference therebetween will be described below. In the present embodiment, referring to FIG. 10A, after the de-bonding layer 140 is formed on the rigid carrier 50, a flexible substrate 110' is formed on the de-bonding layer 140 and patterned, wherein the patterning method may be etching, digging or imprinting as mentioned above. Then, the stretchable material layer 120 is formed on the flexible substrate 110', and the stretchable material layer 120 is filled in the gap between every two adjacent distributed regions 112. Afterwards, a conductive layer 130' is formed on the stretchable material layer 120. Then, referring to FIG. 10B, the conductive layer 130' is patterned to form at least one electronic device 130. Thereafter, referring to FIG. 10C, the stretchable material layer 120 is imprinted by using a bump mold 90, and thereby, patterns of the stretchable material layer 120 are formed. The imprinted stretchable material layer 120 is illustrated in FIG. 10D.

Afterwards, referring to FIG. 10E, the part of the flexible substrate 110' covering the edges of the de-bonding layer 140 is cut off, such that the de-bonding layer 140 is peeled off from the rigid carrier 50, and the remaining structure foul's the stretchable flexible electronic module.

With reference to FIG. 7G and FIG. 2I, in an embodiment, after the de-bonding layer 140 is peeled off as illustrated in FIG. 7G, a covering layer 150 may be formed on the patterned flexible substrate (i.e., the patterned flexible substrate 110) as illustrated in FIG. 2I. The patterned flexible substrate 110 is disposed between the stretchable material layer 120 and the covering layer 150, and a material of the covering layer 150 is a stretchable material. The covering layer 150 is capable of reducing the phenomenon that the patterned flexible substrate 110 may be possibly peeled off from the stretchable material layer 120.

Figure 11:
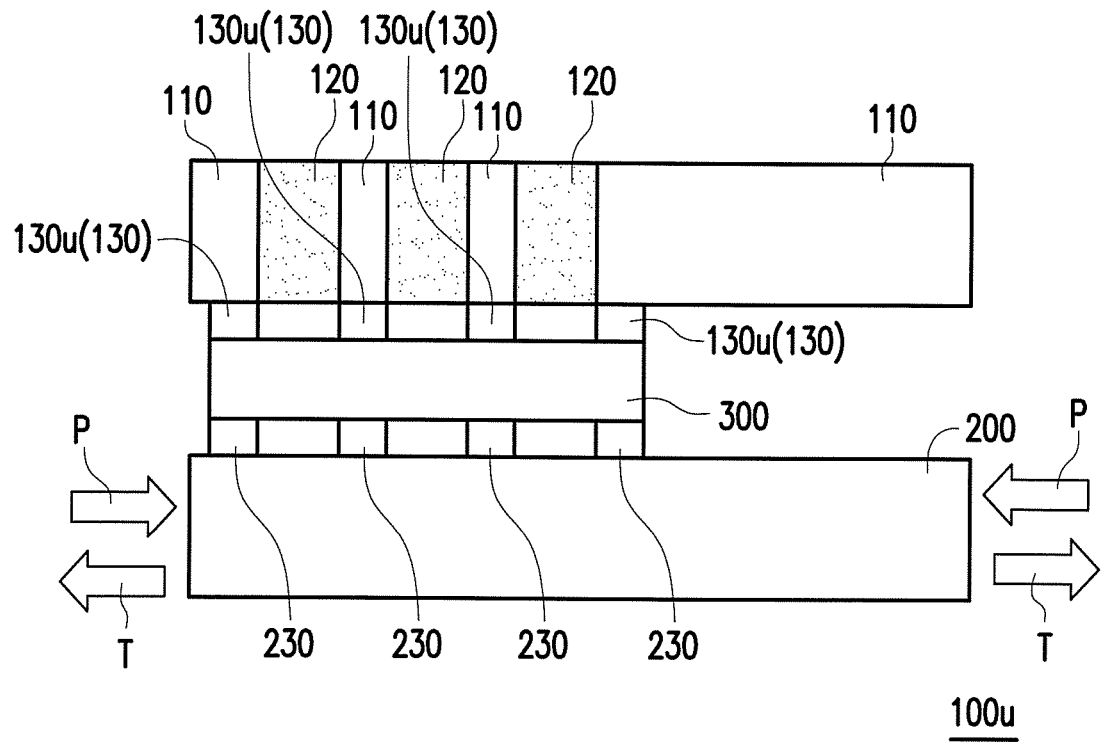
FIG. 11 is a schematic cross-sectional diagram illustrating a flexible electronic module according to another embodiment of the disclosure.

FIG. 11 is a schematic cross-sectional diagram illustrating a flexible electronic module according to another embodiment of the disclosure. With reference to FIG. 11, a flexible electronic module 100u of the present embodiment is similar to the flexible electronic module 100o illustrated in FIG. 4A, and the difference therebetween will be described as follows. In the flexible electronic module 100u of the present embodiment, the electronic devices 130 includes a plurality of first electrodes 130u, the stretchable material layer 120 is distributed between every two first electrodes 130u, and the patterned flexible substrate 110, the stretchable material layer 120 and the electronic devices 130 form a flexible printed circuit (FPC).

In the present embodiment, the flexible electronic module 100u further includes a flexible electronic device 200 including a plurality of second electrodes 230. The second electrodes 230 are respectively electrically connected with the first electrodes 130u through an anisotropic conductive film 300.

In this way, when the second electrodes 230 are displaced due to the flexible electronic device 200 receiving a pressure P or a tension T, the first electrodes 130u may also be correspondingly displaced since the stretchable material layer 120 is distributed between every two first electrodes 130u. Thereby, the electrical connection between the first electrodes 130u and the second electrodes 230 can be ensured.

Figure 12:
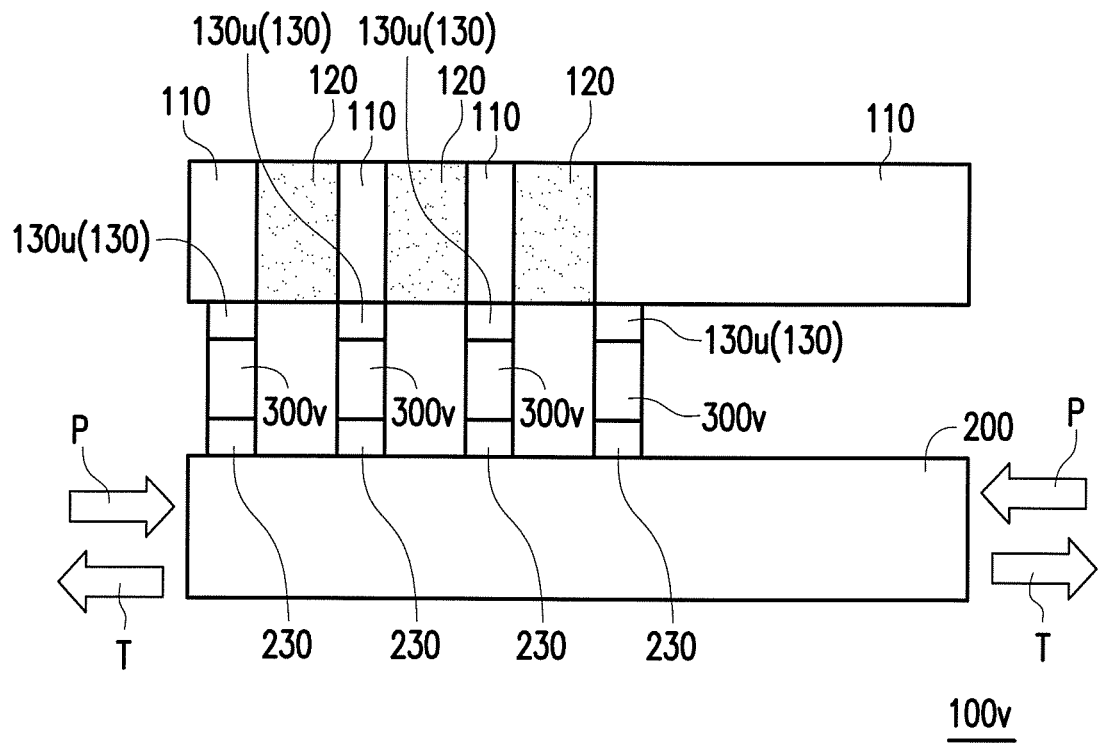
FIG. 12 is a schematic cross-sectional diagram illustrating a flexible electronic module according to yet another embodiment of the disclosure.

FIG. 12 is a schematic cross-sectional diagram illustrating a flexible electronic module according to yet another embodiment of the disclosure. With reference to FIG. 12, a flexible electronic module 100v of the present embodiment is similar to the flexible electronic module 100u illustrated in FIG. 11, and the difference therebetween will be described as follows. In the flexible electronic module 100v of the present embodiment, the second electrodes 230 are respectively electrically connected with the first electrodes 130u through a plurality of anisotropic conductive films 300v, and the anisotropic conductive films 300v may be a plurality of anisotropic conductive films 300v separated from one another. The flexible electronic module 100v may achieve effects similar to those of the flexible electronic module 100u and thus, will not be repeatedly described.

Figure 13:
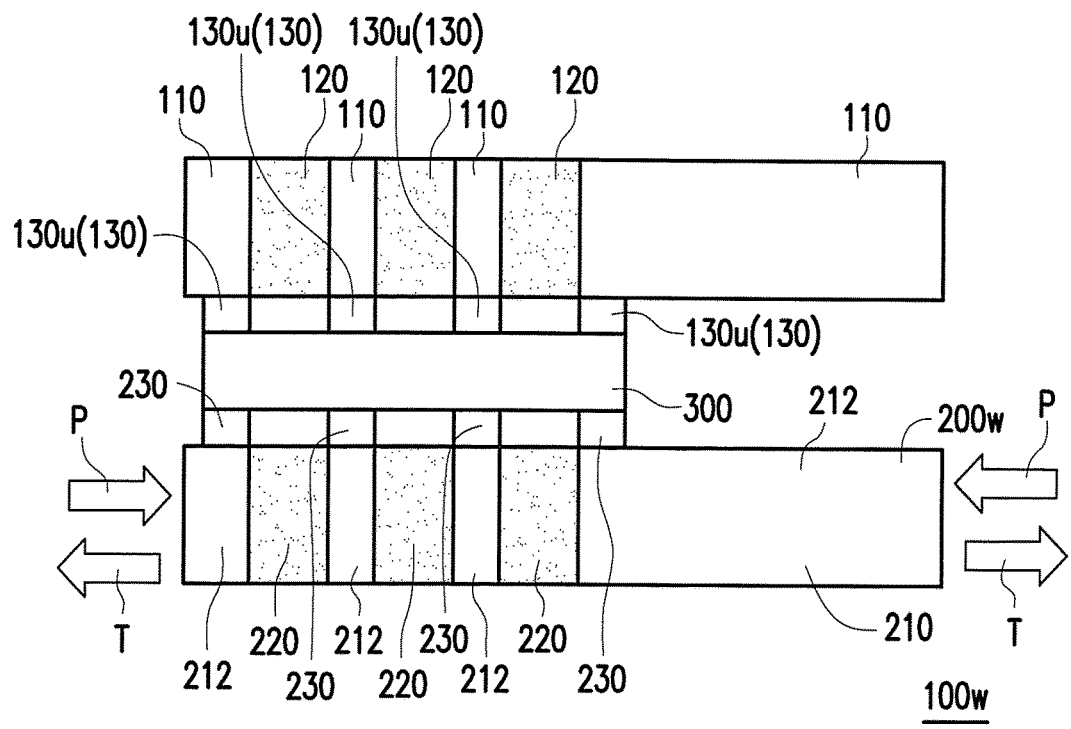
FIG. 13 is a schematic cross-sectional diagram illustrating a flexible electronic module according to still another embodiment of the disclosure.

FIG. 13 is a schematic cross-sectional diagram illustrating a flexible electronic module according to still another embodiment of the disclosure. With reference to FIG. 13, a flexible electronic module 100w of the present embodiment is similar to the flexible electronic module 100u illustrated in FIG. 11, and the difference therebetween will be described as follows. In the flexible electronic module 100w of the present embodiment, a flexible electronic device 200w includes another patterned flexible substrate 210 and another stretchable material layer 220. The patterned flexible substrate 210 and the stretchable material layer 220 may be implemented as the manner that the patterned flexible substrate 110 and the stretchable material layer 120 are implemented in the aforementioned various embodiments. The patterned flexible substrate 210 includes at least one distributed region 212 (which is illustrated as a plurality of distributed regions 212 in FIG. 13 for example), and the second electrodes 230 are disposed on the distributed regions 212. The stretchable material layer 220 connects the distributed regions 212 and is disposed between the second electrodes 230.

The flexible electronic module 100w of the present embodiment may achieve the similar effect of the flexible electronic module 100u. Namely, when the flexible electronic device 200w receives the pressure P or the tension T, the displacement of the first electrodes 130u and the second electrodes 230 may be flexible with the existence of the stretchable material layer 220 and the stretchable material layer 120, so as to ensure the displacement of the first electrodes 130u being consistent with the displacement of the second electrodes 230, and ensure the electrical connection between the first electrodes 130u and the second electrodes 230.

Figure 14:
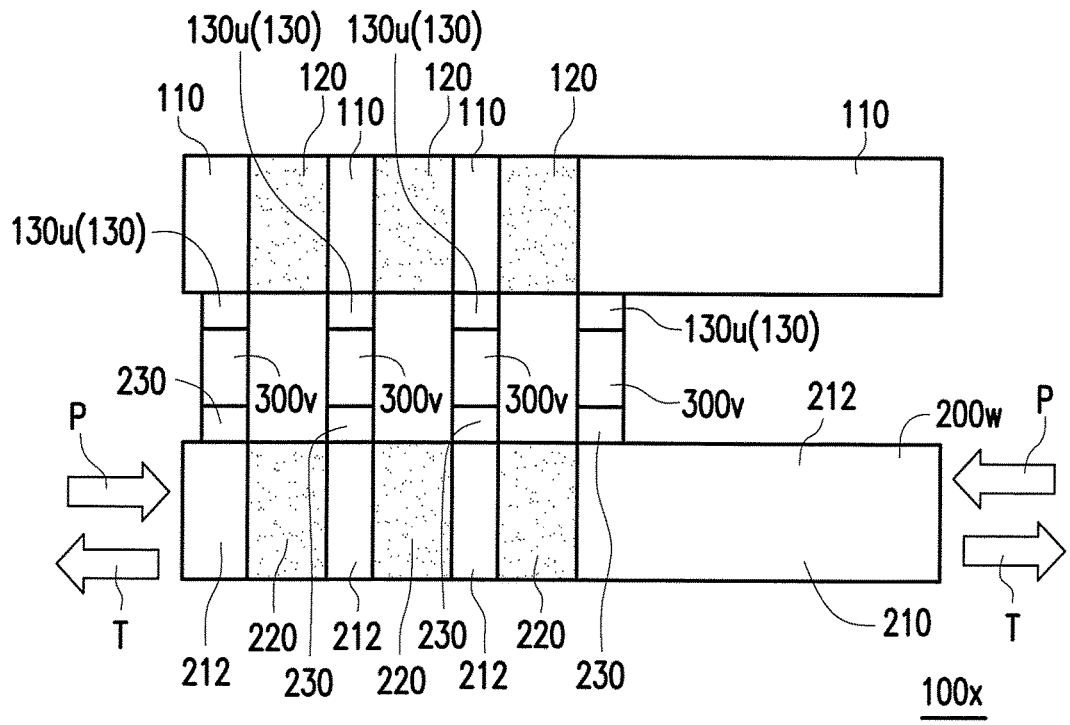
FIG. 14 is a schematic cross-sectional diagram illustrating a flexible electronic module according to another embodiment of the disclosure.

FIG. 14 is a schematic cross-sectional diagram illustrating a flexible electronic module according to another embodiment of the disclosure. With reference to FIG. 14, a flexible electronic module 100x of the present embodiment is similar to the flexible electronic module 100w illustrated in FIG. 13, and the difference therebetween will be described as follows. In the flexible electronic module 100x of the present embodiment, the second electrodes 230 are respectively electrically connected with the first electrodes 130u through a plurality of anisotropic conductive films 300v, and the anisotropic conductive films 300v may be a plurality of anisotropic conductive films 300v separated from each other.

To summarize, in the flexible electronic module introduced by the embodiments of the disclosure, the stretchable material layer connects the distributed regions, and thus, the flexible electronic module can be provided with the effect of stretching depending on demands, so as to increase the applicability of the flexible electronic module. In the manufacturing method of the flexible electronic module introduced by the embodiments of the disclosure, since the stretchable material layer for connecting the distributed regions is formed, and thus, the stretchable flexible electronic module can be therefore manufactured.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A flexible electronic module, comprising:
   a patterned flexible substrate, comprising at least one distributed region;
   a stretchable material layer, connected with the distributed region; and
   at least one electronic device, disposed on at least one of the patterned flexible substrate and the stretchable material layer, the at least one electronic device comprising a stretchable conductive wire, wherein the at least one electronic device further comprises a plurality of first electrodes disposed on the patterned flexible substrate and a plurality of bonding pads, and the stretchable material layer is distributed between the first electrodes; and
   wherein the stretchable conductive wire, the plurality of bonding pads, and the plurality of first electrodes are respectively disposed on the distributed regions of the patterned flexible substrate having same height.

2. The flexible electronic module according to claim 1, wherein a ratio of a Young's modulus of the patterned flexible substrate to a Young's modulus of the stretchable material layer is greater than or equal to 10.

3. The flexible electronic module according to claim 1, wherein at least part of the at least one distributed region comprises a plurality of island structures separately from each other.

4. The flexible electronic module according to claim 1, further comprising:
   a covering layer, wherein the patterned flexible substrate is disposed between the stretchable material layer and the covering layer, and a material of the covering layer comprises a stretchable material.

5. The flexible electronic module according to claim 1, further comprising:
   a de-bonding layer, disposed on the patterned flexible substrate.

6. The flexible electronic module according to claim 5, wherein the de-bonding layer is further disposed on the stretchable material layer.

7. The flexible electronic module according to claim 5, wherein an adhesive force between the stretchable material layer and the patterned flexible substrate is greater than an adhesive force between the patterned flexible substrate and the de-bonding layer.

8. The flexible electronic module according to claim 1, wherein the patterned flexible substrate, the stretchable material layer and the at least one electronic device form a flexible printed circuit (FPC).

9. The flexible electronic module according to claim 8, further comprising:
   a flexible electronic device, comprising a plurality of second electrodes, the second electrodes being respectively electrically connected with the first electrodes through an anisotropic conductive film, or respectively through a plurality of anisotropic conductive films.

10. The flexible electronic module according to claim 9, wherein the flexible electronic device comprises:
    another patterned flexible substrate, comprising at least another distributed region, wherein the second electrodes are disposed on the another distributed region; and
    another stretchable material layer, connected with the another distributed region and disposed between the second electrodes.

11. The flexible electronic module according to claim 1, wherein at least part of the at least one distributed region comprises a plurality of bump structures, a recess is between every two adjacent bump structures of the patterned flexible substrate, and the every two adjacent bump structures are connected together through a bottom of the recess.

* * * * *